United States Patent [19]

Wiesmann

[11] Patent Number: 4,536,607
[45] Date of Patent: Aug. 20, 1985

[54] PHOTOVOLTAIC TANDEM CELL

[76] Inventor: Harold J. Wiesmann, 1662 Roland Ave., Wantagh, N.Y. 11793

[21] Appl. No.: 585,159

[22] Filed: Mar. 1, 1984

[51] Int. Cl.$^3$ .............................................. H01L 31/06
[52] U.S. Cl. .................................... 136/249; 136/244; 136/258; 357/30
[58] Field of Search ........... 136/244, 249 TJ, 258 PC, 136/258 AM, 260, 265; 357/30

[56] References Cited

U.S. PATENT DOCUMENTS

| | | | |
|---|---|---|---|
| 4,292,461 | 9/1981 | Hovel | 136/249 TJ |
| 4,387,265 | 6/1983 | Dalal | 136/249 TJ |
| 4,496,788 | 1/1985 | Hamakawa et al. | 136/249 TJ |

OTHER PUBLICATIONS

J. C. C. Fan et al., *Solar Cells*, vol. 10, pp. 81–98 (1983).

*Primary Examiner*—Aaron Weisstuch
*Attorney, Agent, or Firm*—Connolly and Hutz

[57] ABSTRACT

A photovoltaic tandem cell comprises an amorphous cell and a polycrystalline heterojunction cell. The cells are in optical series and separated by a transparent contact layer.

38 Claims, 2 Drawing Figures

PHOTOVOLTAIC TANDEM CELL

BACKGROUND OF INVENTION

The 1982 worldwide market for photovoltaic power generating modules was served almost exclusively by polycrystalline silicon and single crystalline silicon. The best modules made from these materials were 10% efficient and cost $6./peak watt when purchased in large quantity. To achieve significant penetration of the U.S. central station power generation market, flat plate modules must be manufactured for $25./m² to $50./m² with efficiencies of 15% to 25%. The high cost associated with polycrystalline silicon and single crystal silicon is a consequence of the indirect absorption of light. This necessitates a photovoltaic cell approximately 300 microns thick.

Alternative materials which have been investigated for photovoltaic use are thin film amorphous silicon alloy photovoltaic devices and heterojunction photovoltaic devices based on CdS and (Cd,Zn)S alloys. These materials are amenable to continuous mass production and cost projections for modules with 10% efficiency or greater are less than $1./peak watt.

Amorphous semiconducting alloys have been considered for use in photovoltaic devices to convert sunlight into electricity. One alloy which has received scrutiny is hydrogen containing amorphous silicon. This alloy can be deposited over large areas from the gas phase by glow discharge decomposition of silicon bearing gases. The thickness of a photovoltaic cell composed of amorphous silicon need only be ½ micron thick for the efficient collection of sunlight. Hydrogen containing amorphous silicon (hereinafter called amorphous silicon) refers to the material formed by glow discharge decomposition of silane as described by Carlson in U.S. Pat. No. 4,064,521, the details of which are incorporated herein by reference thereto. The amorphous silicon may also contain other elements such as fluorine. An example is the glow discharge decomposition of $SiF_4+H_2$ mixtures as taught in U.S. Pat. No. 4,226,898, the details of which are incorporated herein by reference thereto.

Photovoltaic devices (hereinafter called photovoltaic cells) of amorphous silicon have achieved AM1 efficiencies of 10% for devices 1 cm² in area. Three photovoltaic heterojunction cells utilizing CdS have reached laboratory efficiencies of 10%. These are CdS-CdTe and $CdS-CuInSe_2$ and $CdS-Cu_2S$. All three heterojunction structures are considered "Thin Film" solar cells because they can be fabricated with a thickness of 20 microns or less. $CdS-Cu_2S$ refers to the method and material as described by Carlson et al, U.S. Pat. No. 2,820,841, the details of which are incorporated herein by reference thereto. $CdS-CuInSe_2$ refers to the method and material as disclosed in Mickelsen U.S. Pat. No. 4,335,266.

The efficiency of the amorphous silicon photovoltaic cells and the CdS based photovoltaic heterojunction cells can be increased by 50% if combined into a photovoltaic tandem cell.

Dalal discloses in U.S. Pat. No. 4,387,265 a photovoltaic tandem cell comprising at least two p(+) i n(+) amorphous cells in optical series and sharing a transparent ohmic contact layer.

Dalal also discloses a photovoltaic $CdS-Cu_2S$, $CdS-Cu_2S$ tandem cell.

Hanak, in U.S. Pat. No. 4,292,092, discloses a method for laser scribing a plurality of semiconductor layers including amorphous silicon, CdS, and $Cu_2S$.

Hovel, in U.S. Pat. No. 4,289,920, discloses a photovoltaic amorphous cell in optical series with a photovoltaic crystalline cell, said cells separated by an insulator.

Hovel, in U.S. Pat. No. 4,292,461, discloses a tandem cell having a higher bandgap amorphous cell and a lower bandgap photovoltaic homojunction crystalline cell joined by an optically transparent conducting layer.

Dalal, in U.S. Pat. No. 4,253,882, discloses a photovoltaic amorphous silicon-crystalline silicon homojunction tandem cell.

A detailed calculation by the inventor has revealed that an amorphous silicon photovoltaic cell in conjunction with a $CdS-Cu_2S$ heterojunction photovoltaic cell is an ideal combination of materials for a photovoltaic tandem cell. Amorphous silicon is the only material which can easily solve the problem of current matching in the photovoltaic solar cell. This is possible because of the unique mode of decomposition of amorphous silicon, glow discharge decomposition. The processing sequence and processing temperatures for the fabrication of the proposed photovoltaic tandem cell are compatible with glass as a substrate and the amorphous silicon being deposited thereon first.

Using current state of the art material properties for both amorphous silicon, CdS, and $Cu_2S$, the calculated efficiency of the proposed photovoltaic tandem cell is 15%. Large area modules with efficiencies of 10% or greater at low cost now become a realistic manufacturing possibility.

The most critical factor in determining the efficiency of a photovoltaic tandem cell (hereinafter called tandem cell) is the need to match the short circuit currents of both the top and bottom cells. The total current from a tandem cell can be no greater than the smallest current generated by either the top or bottom cell. The thickness of the amorphous silicon top cell can be precisely controlled by interrupting the glow discharge at the appropriate time. In addition, the band gap can be varied by either varying the substrate temperature during deposition or incorporating carbon, germanium, nitrogen, oxygen, or fluorine into the amorphous matrix. The use of either technique allows one to control the amount of light absorbed or alternatively, the current generated in the amorphous cell, said current being made equal to that generated in the $CdS-Cu_2S$ cell. The efficiency of a tandem cell can be calculated by the following procedure.

CURRENT

Amorphous silicon with a band gap of 1.7 eV has a theoretical short circuit current $(J_{sc})=16.7$ ma. $Cu_2S$ with a band gap of 1.24 eV has a theoretical $J_{sc}=35$ ma. The photon economy for a tandem cell would appear as follows.

TABLE I

| CUMULATE NET CURRENT (ma/cm²) | LOSSES | CURRENT LOSSES (ma/cm²) |
|---|---|---|
| 35.00 | Grid Shadowing, approx. 5% | −1.75 |
| 33.25 | Reflection, approx. 5% of ungridded area | −1.66 |
| 31.59 | Amorphous Silicon N+ layer, $E_o=2.0$ eV; 80 angstroms, thick | −0.70 |
| 30.89 | Absorption in Amorphous | −14.63 |

TABLE I-continued

| CUMULATE NET CURRENT (ma/cm²) | LOSSES | CURRENT LOSSES (ma/cm²) |
| --- | --- | --- |
| | Silicon Intrinsic layer, 0.5 microns thick | |
| 16.26 | CdS—Cu₂S interface recombination 4% | −0.65 |
| 15.61 | Absorption in Rear Contact, 6% | −0.97 |
| 14.64 | Absorption in Cu₂S layer | −14.63 |

Once parasitic losses are determined the thickness and/or bandgap of the amorphous silicon top cell can always be adjusted so that the total available current is evenly divided between the top and bottom cell as described previously.

VOLTAGE

Amorphous silicon has generated a wide range of voltages depending on the exact deposition conditions. For example, the inventor has achieved 0.9 volts using N/I/P/SS structures. For CdS-Cu₂S solar cells 0.5 volts at AM1 is routinely achieved. In tandem cells the voltages add.

$$V_{oc} = 0.90 \text{ volts} + 0.5 \text{ volts} = 1.4 \text{ volts}$$

FILL FACTOR (F.F.)

Amorphous silicon solar cells have reached Fill Factor values as high as 0.75. CdS-Cu₂S routinely achieves a F.F. of 0.75. As the Fill Factor in a tandem cell is approximately the average of the two values, a F.F. of 0.75 seems reasonable.

TANDEM CELL

Efficiency = 14.63 ma/cm² × 1.4 volts × 0.75 F.F. = 15.36%

EACH CELL SEPARATELY

Amorphous Silicon Efficiency = 14.63 ma/cm² × 0.9 volts × 0.75 F.F. = 9.87%.

CdS-Cu₂S efficiency = 29.62 ma/cm² × 0.5 volts × 0.75 F.F. = 11.10%.

The estimate for the attainable efficiency of the tandem cell is considered to be somewhat conservative. The inventor has observed $V_{oc} = 0.99$ volts, which is the highest value ever reported, for amorphous silicon N/I/P/SS solar cells. These open circuit voltages have been confirmed by SERI, Golden, Colo. Substituting some zinc for cadmium in CdS-Cu₂S cells should, in theory, increase $V_{oc}$ to $V_{oc} = 0.86$ volts.

Assuming ideal diode behavior and no voltage or current losses for either cell, the maximum attainable efficiency for the tandem cell is:

Tandem Cell Limiting Efficiency = 2.06 volts × 17.5 ma/cm² × 0.89 F.F. = 32%.

TECHNICAL BENEFITS OF THE PHOTOVOLTAIC AMORPHOUS SILICON, CdS-Cu₂S TANDEM CELL

The highest quality amorphous silicon is made by glow discharge decomposition. This means that amorphous silicon is the only solar cell grade material for which the thickness and hence the short circuit current can be precisely controlled. The highest quality amorphous silicon has a band gap of approximately 1.7 eV which is almost perfect for use in amorphous silicon CdS-Cu₂S tandem solar cell. Amorphous silicon and alloys of amorphous silicon could also serve as the top cell in tandem cells utilizing CdS/CuInSe₂, CdS/CdTe, or CdS/InP as the low band gap cell.

The only high temperature processing step for the cell construction proposed in FIG. 1 herein is the application of the transparent conductive oxide (TCO). The TCO is the first layer to be applied and therefore does not interfere with subsequent depositions. The low deposition temperatures involved for all the layers, less than 300° C., precludes impurity diffusion between the layers, thereby making precisely defined interfaces in the tandem cell possible.

One of the main stumbling blocks to the utilization of both amorphous silicon and CdS/Cu₂S single junction cells has been instabilities. For amorphous silicon it has recently been shown that an electric field of $2 \times 10^4$ volts/cm or greater is necessary in order to stabilize the cell. This limits stable amorphous silicon solar cells to a thickness of ½ micron. Efforts to increase the efficiency of single junction amorphous silicon cells have revolved around increasing the thickness of the intrinsic layer which reduces the electric field below the critical value and hence makes the cells unstable. In the tandem cell of the type to which the invention is directed, ½ micron of amorphous silicon is an ideal thickness for current sharing with a CdS-Cu₂S cell. In a recent presentation, amorphous silicon solar cells produced by the inventor have been shown to have efficiencies exceeding 5% and be stable. These cells have been under continuous AM1 illumination for over three months at a temperature of 60° C.

CdS-Cu₂S solar cells are extremely sensitive to oxidation. The growth of a single monolayer of Cu₂O can cause enough reduction in the stoichiometry of the Cu₂S layer yielding material with unacceptable electronic properties. There appears to be no plastic known which can serve as an acceptable front cover for the Cu₂S layer in front wall cells. This is due to the fact that all plastics are, to some extent, semipermeable to both water and oxygen. Using CdS-Cu₂S in the back wall configuration as in the proposed tandem cell eliminates this problem because the thin metallic back contact serves as a hermetic seal for the Cu₂S layer.

The Cu₂S layer, in the front wall configuration, can be no thicker than the diffusion length of the minority carriers. This is because the built-in electric field is at the CdS-Cu₂S interface but the light is being absorbed and the minority carriers generated at the opposite side of the Cu₂S layer. The minority carriers must, therefore, diffuse to the built-in electric field.

The proposed tandem cell configuration has no such constraint as the light is absorbed at the CdS-Cu₂S interface. The Cu₂S layer can now be grown much thicker—5000 angstroms. This will reduce the effect of any change in the Cu₂S layer stoichiometry due to oxidation. The Cu₂S layer, being at the rear of the cell, can be coated with a thick opaque metallic back contact which affords a true hermetic seal.

Other benefits also accrue to the proposed structure. CdS-Cu₂S solar cells in the front wall configuration require an extremely fine metallic grid. This grid, which is deposited onto the Cu₂S layer, must be fine due to the extremely small thickness of the Cu₂S layer of 2000 angstroms. Eliminating the grid with a solid back metallic contact will increase the fill factor of the cell. The solar cell yields are expected to improve due to the thicker allowable $Cu_2S$ layer in the tandem configuration. The current sharing reduces the current density which allows for wider transparent conductive oxide stripes when integrating the tandem cells into a series connected structure on glass substrates.

SUMMARY OF THE INVENTION

In accordance with this invention, a tandem cell comprises an amorphous silicon cell and a $CdS$-$Cu_2S$ or $CdS$-$CuInSe_2$ cell in optical and electrical series which when employed as a photovoltaic device is characterized by equal current generation in the amorphous silicon cell and the $CdS$-$Cu_2S$ or $CdS$-$CuInSe_2$ cell.

In one embodiment, the tandem cell comprises, in order from top to bottom:
an electrically conducting superstrate,
a first cell comprising layers (a), (b), and (c), wherein:
(a) is a first doped semiconductor layer of a first conductivity type selected from amorphous silicon, a-(Si,C), a(Si,N), hydrogen containing amorphous germanium, alone and in mixture, and microcrystalline silicon,
(b) is an intrinsic semiconductor layer selected from amorphous silicon alone and amorphous silicon and hydrogen containing amorphous germanium in mixture, and
(c) is a second doped semiconductor layer of a second conductivity type selected from the semiconductor material of (a) alone and in mixture;
a transparent or semitransparent highly conductive contact layer;
a second cell comprising layers (d) and (e), wherein:
(d) is a first polycrystalline semiconductor layer of a first conductivity type, and
(e) is a second polycrystalline layer of a second conductivity overlying said first polycrystalline layer and forming a p-n heterojunction therewith; and
an electrical contact layer.

THE DRAWINGS

FIG. 1 is a cross-sectional view in elevation of a tandem cell in accordance with the invention; and FIG. 2 is a cross-sectional view in elevation of an alternative tandem cell in accordance with this invention.

DETAILED DESCRIPTION

Attempts to deposit CdS directly onto amorphous silicon were unsuccessful. The CdS did not stick to the amorphous silicon. By depositing a transparent conductive oxide onto the amorphous silicon first and next depositing the CdS it has been possible to obtain a stable structure. In the embodiment shown in FIG. 1, there is illustrated an amorphous silicon—transparent conductive oxide—$CdS/Cu_2S$ (or $CdS/CuInSe_2$) tandem solar cell structure. The structure shown in FIG. 1 uses glass as a superstrate and the amorphous silicon solar cell A is fabricated first.

Figure 2:
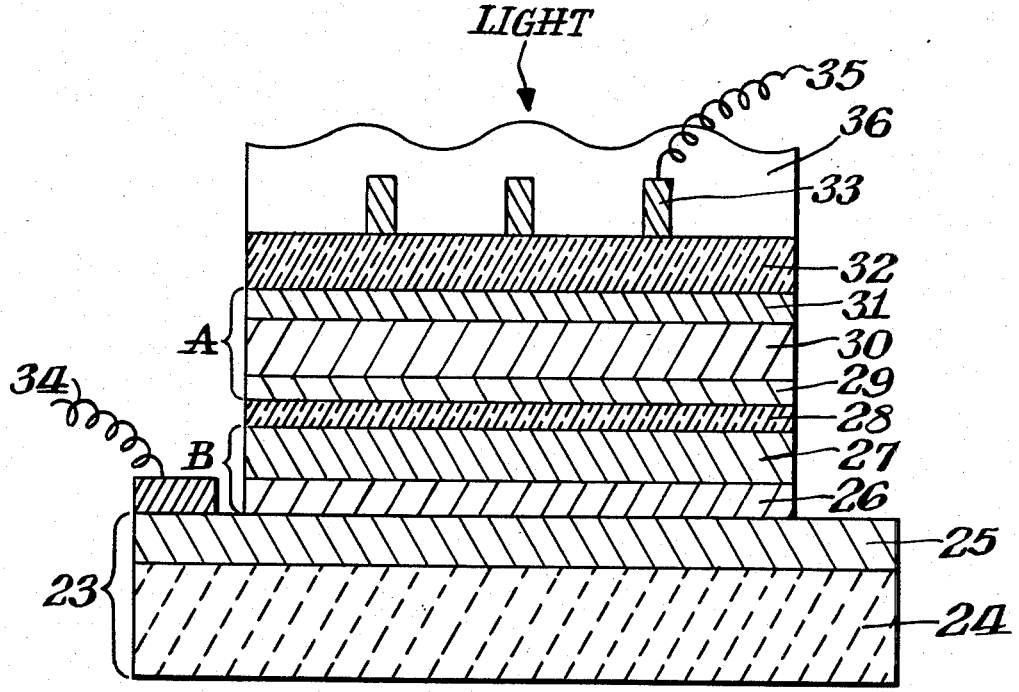

In FIG. 2 the solar cell is fabricated in the opposite manner, i.e., the polycrystalline heterojunction solar cell B is deposited first. Apparently a transparent conductive oxide is needed between the amorphous silicon and CdS layers. This embodiment—FIG. 2—would reduce to an amorphous silicon-transparent conductive oxide-$CdS/CuInSe_2$ (or $CdS/Cu_2S$) tandem solar cell structure.

Figure 1:
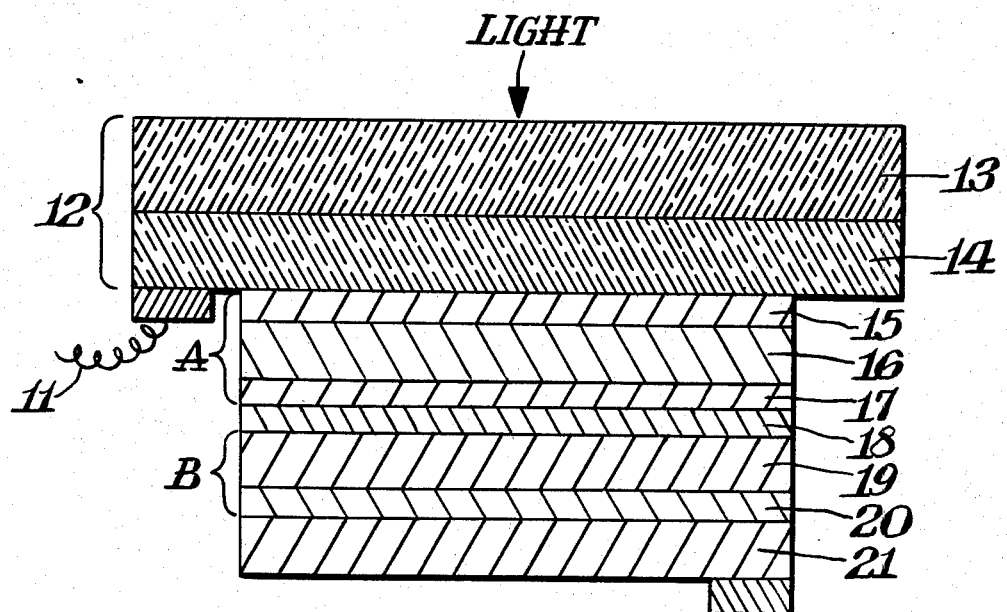

Exemplary of the invention is the two cell photovoltaic tandem cell of FIG. 1. The photovoltaic tandem cell is assembled on an electrically conducting transparent superstrate 12. The superstrate 12, as illustrated herein, mechanically supports the tandem cell and is the body upon which the layers comprising the tandem cell are deposited. For example, one might employ a glass support 13 having thereon a transparent conducting oxide 14 such as tin oxide, indium oxide, zinc oxide, CdO, alone or in mixture to which electrical connection 11 is made as is known in the art. Similarly the oxide 14 may be selected from the group consisting of zinc oxide, cadmium oxide, cadmium stannate, or zinc stannate, alone and in mixture. Alternatively, a thin deposit of a metal may be utilized in place of the transparent conductive oxide 14. The metal may be any of the kind normally used in the art, such as titanium, chromium, aluminum, magnesium, ytterbium, alone or in mixture, or the like. The thickness of the metal should not exceed 100 angstroms.

Such an arrangement permits the admission of light to the top of the tandem cell as indicated in FIG. 1.

Underlying superstrate 12 is a first doped amorphous semiconductor layer 15 of a first conductivity type. This layer may be any of the kind normally used in the art, such as amorphous silicon or its alloys which are preferred. Conductivity of the n(+) type is preferred. Phosphorous or arsenic can be employed as dopants.

On the first doped layer 15 is an intrinsic layer 16 which comprises an undoped or lightly doped amorphous semiconductor. Amorphous silicon is preferred.

On intrinsic layer 16 is a second doped amorphous semiconductor layer 17 of a second conductivity type. This layer may be any of the kind normally used in the art, such as amorphous silicon or its alloys which are preferred. Conductivity is of the type opposite that of layer 15, thus preferably p(+). Aluminum, gallium, or preferably boron can be employed as dopants.

Layers 15, 16 and 17 comprise an amorphous cell labelled A in FIG. 1.

On layer 17 is a transparent or semitransparent highly conductive layer 18. Layer 18 comprises a transparent conducting oxide, or the like, alone or in mixture. Layer 18 may also comprise a thin deposit of metal such as platinum, nickel, ytterbium, titanium, chromium, molybdenum, magnesium or the like, alone or in mixture. The metal should not be so thick as to be opaque. A thickness of 100 angstroms or less is preferred. Layer 18 may also comprise a cermet as taught by Hanak in U.S. Pat. No. 4,167,015, the details of which are incorporated herein by reference thereto.

On layer 18 is a polycrystalline semiconductor layer 19 preferably of the same conductivity type as layer 15. Cadmium sulfide or an alloy of zinc sulfide and cadmium sulfide is preferred.

On layer 19 is a polycrystalline semiconductor layer 20 preferably of the same conductivity type as layer 17. $Cu_2S$ or $CuInSe_2$ is preferred.

Layers 19 and 20 comprise the polycrystalline heterojunction cell labelled B in FIG. 1.

On layer 20 is an electrical contact layer 21. This layer 21 may be a metal such as molybdenum, silver, gold, copper, chromium or the like, alone or in mixture. Copper and chromium alone or in mixture is preferred as taught in U.S. Pat. No. 4,260,428, the details of which are incorporated herein by reference thereto, when layer 20 is $Cu_2S$. Molybdenum is preferred when layer 20 is $CuInSe_2$.

A variation of the invention is shown in FIG. 2. In this embodiment, layers 24 and 25 combined serve as an electrically conducting substrate 23. The substrate 23 can be a thin metallic layer 25 supported on an insulator 24, said insulator 24 being selected from the kind normally used in the art, such as glass, alumina, ceramic, or the like. Alternatively, substrate 23 may be a sheet of any electrically conducting material, such as metals, for example, iron, stainless steel, molybdenum, aluminum, chromium plated steel, chromium plated brass, copper or the like.

Overlying the substrate 23 is a polycrystalline semiconductor layer 26 of a first conductivity type. This layer may be any of the kind normally used in the art such as $CuInSe_2$, which is preferred, or CdTe or InP. Conductivity of the p(+) type is preferred.

On layer 26 is a polycrystalline semiconductor layer 27 of a second conductivity type, opposite that of layer 26, thus preferably n(+). CdS alone or CdS and ZnS in mixture is preferred.

Layers 26 and 27 comprise the polycrystalline heterojunction cell labelled B in FIG. 2.

On layer 27 is a transparent or semitransparent highly conductive layer 28. Layer 28 comprises a transparent conducting oxide known to the art, such as indium oxide, tin oxide or the like, alone or in mixture. The layer 28 may also comprise a thin deposit of a metal such as platinum, nickel, ytterbium, titanium, chromium, molybdenum, magnesium or the like, alone or in mixture. The metal should not be so thick as to be opaque. A thickness of 100 angstroms or less is preferred. Layer 28 may also comprise a cermet as taught by Hanak in U.S. Pat. No. 4,167,015, the details of which are incorporated herein by reference thereto.

On layer 28 is a first doped amorphous semiconductor layer 29 of the same conductivity type as layer 26. This layer 29 may be any of the kind normally used in the art, such as amorphous silicon or its alloys which are preferred. Aluminum, gallium, or preferably boron can be employed as dopants.

On the first doped amorphous layer 29 is an intrinsic layer 30 which comprises an undoped or lightly doped amorphous semiconductor. Amorphous silicon is preferred.

On layer 30 is a second doped amorphous semiconductor layer 31 of the same conductivity type as layer 27. This layer 31 may be any of the kind normally used in the art, such as amorphous silicon or its alloys which are preferred. Phosphorus or arsenic can be employed as dopants.

Layers 29, 30 and 31 comprise the amorphous cell labelled A in FIG. 2.

On layer 31 is an electrical contact layer 32. This layer may be any of the kind normally used in the art, such as tin oxide, indium oxide, zinc oxide, CdO alone or in mixture and optionally in combination with a metallic grid 33. Encapsulating layer 34 is formed over grid 33.

Useless photon absorption in the n(+) and p(+) doped amorphous layers 15, 17, 29, and 31 in cell A of FIGS. 1 and 2 can be minimized in the cell design. This would be accomplished by employing amorphous alloys for those layers with bandgaps larger than the intrinsic amorphous layer 30 or 16. p(+) and n(+) layers with wide bandgaps can be obtained, for example, by employing amorphous doped mixtures of silicon, carbon, and hydrogen as is known in the art and hereinafter called a-(Si,C). p(+) and n(+) amorphous doped mixtures of silicon, nitrogen, and hydrogen hereinafter called a-(Si,N) may also be employed.

The p(+) and n(+) doped amorphous layers 15, 17, 29 and 31 may be comprised of mixtures of crystalline silicon and amorphous silicon, doped with boron for p(+) conductivity and phosphous or arsenic for n(+) conductivity and known in the art as microcrystalline silicon.

The tandem cell of the instant invention can be prepared by various combinations of methods known in the art. For example, in the preferred embodiment one might select glass 13 as the transparent supporting substrate and deposit thereon an about 2000 angstroms thick transparent conductive oxide layer 14 comprising a mixture of $In_2O_3$ and $SnO_2$. Cell A is next deposited. An n(+) layer 15 comprising 100 angstroms thickness of phosphorous doped microcrystalline silicon is deposited thereon by glow discharge decomposition of $SiH_4$, $H_2$, and $PH_3$. An intrinsic layer 16, 5000 angstroms thick is next deposited in a similar manner by the glow discharge decomposition of $SiH_4$ and on this layer a p(+) layer 17 of boron doped microcrystalline silicon 200 angstroms thick is deposited by glow discharge decomposition of $SiH_4$, $H_2$, and $B_4H_6$. Layers 15, 16, and 17 comprise cell A. Next is deposited a 2000 angstroms thick layer 18 comprising a mixture of $In_2O_3$ and $SnO_2$. Cell B is next deposited. A 10 micron thick layer 19 of CdS, doped with indium, is deposited by the method of thermal evaporation. The CdS layer 19 is preferably textured and roughened by a 2 second to 15 second dip in a 1:1 to 1:10 volume ratio of a hydrochloric acid:water solution. The CdS layer 19 is then contacted, usually by dipping, with a solution containing cuprous ions for between 2 seconds to 20 seconds. The preferred solution is a saturated solution of CuCl held at about 80° C. to 100° C. Ion exchange forms the $Cu_2S$ layer 20 as is known in the art. The $Cu_2S$ layer 20 is rinsed and dried. Layers 19 and 20 comprise cell B. A 50 angstroms thick layer of chromium is deposited thereon by the method of thermal evaporation. A 5000 angstroms thick layer of copper is next deposited by methods known in the art. The chromium layer and the copper layer comprise layer 21 in FIG. 1.

Alternatively, in Cell B, after deposition of the CdS semiconductor layer 19, a thin $CuInSe_2$ semiconductor layer 20 may be deposited thereon in lieu of the $Cu_2S$ layer. The $CuInSe_2$ layer 20, about ½ micron thick, may be deposited by methods known in the art, such as vacuum evaporation from multiple crucibles, spray pyrolysis, or sputtering.

The embodiment in FIG. 2 can be prepared by various combinations of methods known in the art. For example, one might select alumina 24 and deposit thereon about a ½ micron thick layer of molybdenum 25. This comprises the electrically conducting substrate 23. Cell B is next deposited. Upon the molybdenum layer 25 is deposited a ½ micron layer 26 of $CuInSe_2$ by the method of vacuum evaporation from multiple crucibles. Next is deposited a 2 micron thick layer 27 of CdS, doped with indium, by thermal evaporation. Layers 26 and 27 comprise cell B. A 500 angstrom thick layer 28 of $In_2O_3$ is next deposited by sputtering. Cell A is next deposited. A p(+) layer 29 of boron doped a-(Si,C) alloy, 100 angstroms thick is deposited by plasma decomposition of $SiH_4$, $CH_4$, and $B_2H_6$. A 5000 angstroms thick intrinsic layer 30 is next deposited by the plasma decomposition of $SiH_4$. A 100 angstroms thick layer 31 of phosphorous doped microcrystalline silicon is deposited thereon by the plasma decomposition of $SiH_4$, $H_2$, and $PH_3$ as is known in the art. Layers 29, 30 and 31 comprise cell A. A 700 angstroms thick layer 32 of $In_2O_3$ and $SnO_2$ in mixture is deposited by sputtering. A metallic grid 33 for current collection is deposited thereon. Encapsulating layer 36 is formed over grid 33.

The layer 18 in FIG. 1 and layer 28 in FIG. 2 should be semitransparent and form a contact with low electrical resistance to both respective adjacent layers. The layers 18 and 28 must demonstrate strong mechanical adhesion to both respective adjacent layers. In the preferred embodiment a thin layer 18 of $In_2O_3$ deposited by methods known in the art, forms a transparent, low resistance electrical contact to p(+) microcrystalline silicon layer 17 and demonstrates good adhesion. The CdS layer 19 doped with indium and deposited by the method of thermal evaporation forms a low resistance contact to said $In_2O_3$ layer 18 and demonstrates adhesion.

What is claimed is:

1. A photovoltaic tandem cell wherein the cells are electrically in series with each other comprising, from top to bottom:
   an electrically conducting superstrate;
   a first cell comprising layers (a), (b), and (c), wherein:
   (a) is a first doped amorphous semiconductor layer of a first conductivity type underlying and in contact with said superstrate,
   (b) is an intrinsic amorphous semiconductor layer underlying said first doped layer, and
   (c) is a second doped amorphous semiconductor layer of said second conductivity type underlying said intrinsic layer;
   a non-opaque, high conductivity layer underlying and in contact with said second doped amorphous semiconductor layer;
   a second cell underlying and in contact with said non-opaque, high conductivity layer, comprising layers (d) and (e), wherein:
   (d) is a first polycrystalline semiconductor layer of a first conductivity type underlying and in contact with said non-opaque high conductivity layer, and
   (e) is a second polycrystalline semiconductor layer of a second conductivity type underlying said first polycrystalline layer and forming a p-n heterojunction therewith; and
   an electrical contact layer underlying and in contact with said second polycrystalline semiconductor layer.

2. The tandem cell of claim 1 wherein said electrically conducting superstrate is a transparent conductive oxide or mixture thereof supported on an insulator.

3. The tandem cell of claim 2 wherein the transparent conductive oxide is selected from the group consisting of indium oxide and tin oxide, alone or in mixture.

4. The tandem cell in claim 2 wherein said insulator is transparent.

5. The tandem cell of claim 1 wherein the doped amorphous semiconductor layers are hydrogen containing amorphous silicon.

6. The tandem cell of claim 5 wherein said first intrinsic semiconductive layer is hydrogen containing amorphous silicon.

7. The tandem cell of claim 6 wherein said first intrinsic semiconductive layer is a mixture of hydrogen containing amorphous silicon and hydrogen containing amorphous germanium.

8. The tandem cell of claim 1 wherein said doped amorphous semiconductor layer of the first conductivity type comprises microcrystalline silicon.

9. The tandem cell of claim 1 wherein said doped amorphous semiconductor layer of the second conductivity type comprises microcrystalline silicon.

10. The tandem cell of claim 1 wherein said first conductivity type is n(+) and said second conductivity type is p(+).

11. The tandem cell of claim 1 wherein said doped amorphous semiconductor layers in said first cell are characterized by a bandgap larger than that of said intrinsic semiconductive layer of said first cell.

12. The tandem cell of claim 11 wherein said doped amorphous semiconductor layer of said first conductivity type is selected from a-(Si,C) and a-(Si,N).

13. The tandem cell of claim 11 wherein said doped amorphous semiconductor layer of said second conductivity type is selected from a-(Si,C) and a-(Si,N).

14. The tandem cell of claim 1 wherein said non-opaque, high conductivity layer is a transparent conductive oxide.

15. The tandem cell of claim 14 wherein said transparent conductive oxide layer is selected from the group consisting of indium oxide and tin oxide, alone and in mixture.

16. The tandem cell of claim 14 wherein said transparent conductive oxide layer is selected from the group consisting of zinc oxide, cadmium oxide, cadmium stannate, or zinc stannate, alone and in mixture.

17. The tandem cell of claim 1 wherein said non-opaque, high conductivity layer is a thin metal layer.

18. The tandem cell of claim 1 wherein said non-opaque, high conductivity layer is a cermet.

19. The tandem cell of claim 1 where said first polycrystalline layer is selected from CdS and a mixture of ZnS and CdS.

20. The tandem cell of claim 19 wherein said first polycrystalline layer is doped with indium.

21. The tandem cell of claim 1 wherein said second polycrystalline layer is selected from $Cu_2S$ and $CuInSe_2$.

22. The tandem cell of claim 21 wherein said $CuInSe_2$ layer comprises a first high resistivity $CuInSe_2$ layer and a second low resistivity $CuInSe_2$ layer, lying thereon, and said first high resistivity layer being adjacent to said first polycrystalline layer and second low resistivity layer being adjacent said electrical contact layer.

23. The tandem cell of claim 1 wherein said electrical contact layer comprises a metal.

24. The tandem cell of claim 23 wherein said metal is selected from the group consisting of chromium and copper, alone and in mixture.

25. The tandem cell of claim 23 wherein said metal is molybdenum.

26. The tandem cell of claim 1 wherein the bandgap of said amorphous semiconductor layers of said first cell is different from the bandgap of the polycrystalline semiconductor layers of said second cell.

27. The tandem cell of claim 1 wherein the bandgap of said intrinisic amorphous semiconductor layer is larger than the bandgap of said second polycrystalline semiconductor layer.

28. The tandem cell of claim 1 wherein the thickness of said intrinsic amorphous semiconductor layer is adjusted to produce a light generated current essentially equal to the light generated current produced by said second polycrystalline semiconductor layer.

29. The tandem cell of claim 1 wherein said first cell is an amorphous silicon cell, and said second cell is a CdS/$Cu_2S$ cell.

30. The tandem cell of claim 1 wherein said first cell is an amorphous silicon cell, and said second cell is a CdS/$CuInSe_2$ cell.

31. The tandem cell of claim 1 wherein said first cell is an amorphous silicon cell and said second cell is a polycrystalline heterojunction cell having CdS as one of its layers, and said cells being in contact with an intermediate transparent conductive oxide which comprises said non-opaque, highly conducting layer.

32. The tandem cell of claim 1 wherein a plurality of separated tandem solar cell stripes are connected in electrical series.

33. A photovoltaic tandem cell wherein the cells are electrically in series with each other comprising, from bottom to top:
   an electrically conducting substrate;
   a polycrystalline heterojunction cell comprising layers (a) and (b), wherein:
      (a) is a first doped polycrystalline semiconductor layer of a first conductivity type overlying and in contact with said substrate, and
      (b) is a second polycrystalline semiconductor layer of a second conductivity type overlying and in contact with said first polycrystalline layer and forming a p-n heterojunction therewith;
   a non-opaque, high conductivity layer overlying and in contact with said polycrystalline layer;
   an amorphous cell comprising layers (c), (d), and (e), wherein:
      (c) is a first doped amorphous semiconductor layer of first conductivity type overlying and in contact with said non-opaque, high conductivity layer,
      (d) is an intrinsic amorphous semiconductor layer overlying and in contact with said first doped amorphous layer, and
      (e) is a second doped amorphous semiconductor layer of a second conductivity type overlying and in contact with said intrinsic amorphous layer; and
      (h) an electrical contact layer overlying and in contact with said second doped amorphous semiconductor layer.

34. The tandem cell in claim 33 wherein said substrate comprises a mechanical support for said cell.

35. The tandem cell of claim 34 wherein said mechanical support is a metal sheet.

36. The tandem cell of claim 34 wherein said mechanical support is a metal supported on an insulator.

37. The tandem cell of claim 33 wherein said electrical contact layer comprises a transparent conductive oxide.

38. The tandem cell of claim 33 wherein said electrical contact layer comprises a transparent conductive oxide in combination with a metallic grid.

* * * * *